United States Patent [19]

Oyamatsu

[11] Patent Number: 5,424,229
[45] Date of Patent: Jun. 13, 1995

[54] METHOD FOR MANUFACTURING MOSFET HAVING AN LDD STRUCTURE

[75] Inventor: Hisato Oyamatsu, Kawasaki, Japan

[73] Assignee: Kabushiki Kaisha Toshiba, Kawasaki, Japan

[21] Appl. No.: 253,836

[22] Filed: Jun. 3, 1994

Related U.S. Application Data

[63] Continuation of Ser. No. 942,943, Sep. 10, 1992, abandoned.

[30] Foreign Application Priority Data

Sep. 12, 1991 [JP] Japan ............... 3-232916

[51] Int. Cl.⁶ ......................................... H01L 21/265
[52] U.S. Cl. ......................................... 437/35; 437/44
[58] Field of Search ........................ 437/35, 44, 41

[56] References Cited

U.S. PATENT DOCUMENTS

| | | | |
|---|---|---|---|
| 3,873,371 | 3/1975 | Wolf | 437/35 |
| 4,208,780 | 6/1980 | Richman | 437/35 |
| 4,258,465 | 3/1981 | Yasui et al. | 437/41 |
| 4,325,747 | 4/1982 | Ristow | 148/1.5 |
| 5,061,975 | 10/1991 | Inuishi et al. | 357/23.4 |
| 5,073,512 | 12/1991 | Yoshino | 437/41 |
| 5,075,242 | 12/1991 | Nakahara | 437/34 |
| 5,212,542 | 5/1993 | Okumura | 257/369 |
| 5,217,910 | 6/1993 | Shimizu et al. | 437/35 |
| 5,219,777 | 6/1993 | Kang | 437/44 |
| 5,258,319 | 11/1993 | Inuishi et al. | 437/44 |
| 5,316,961 | 5/1994 | Okazawa | 437/35 |
| 5,366,915 | 11/1994 | Kodama | 437/35 |

*Primary Examiner*—Olik Chaudhuri
*Assistant Examiner*—Brian K. Dutton
*Attorney, Agent, or Firm*—Spensley Horn Jubas & Lubitz

[57] ABSTRACT

A dielectric film, such as a silicon nitride film, is formed on a p type silicon substrate. An opening is formed in the silicon nitride film. With the silicon nitride film used as a mask, a phosphorns ion is implanted into the surface portion of the substrate in a direction of an angle $\theta$ ($0° < \theta < 90°$) to a substrate face. An $n^-$ diffusion layer is formed in the surface portion of the substrate at an edge area of the opening such that the $n^-$ diffusion layer is located beneath a gate electrode corresponding to the opening. A gate oxide film is formed in that opening area and a polysilicon film is formed over the gate oxide film. A gate electrode is formed after the silicon nitride film has been removed. With the gate electrode used as a mask, an impurity ion is implanted into the surface portion of the substrate to provide source and drain regions. The drain region is located contagious to an $n^-$ diffusion layer. The $n^-$ diffusion layer is formed beneath the gate electrode only.

8 Claims, 4 Drawing Sheets

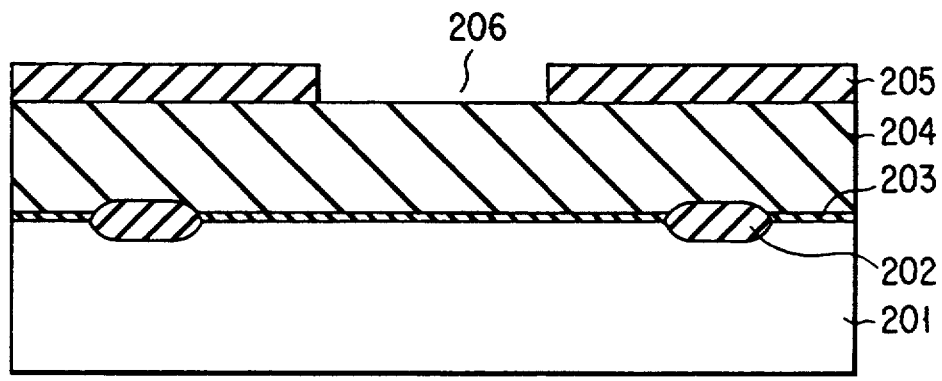
F I G. 4A
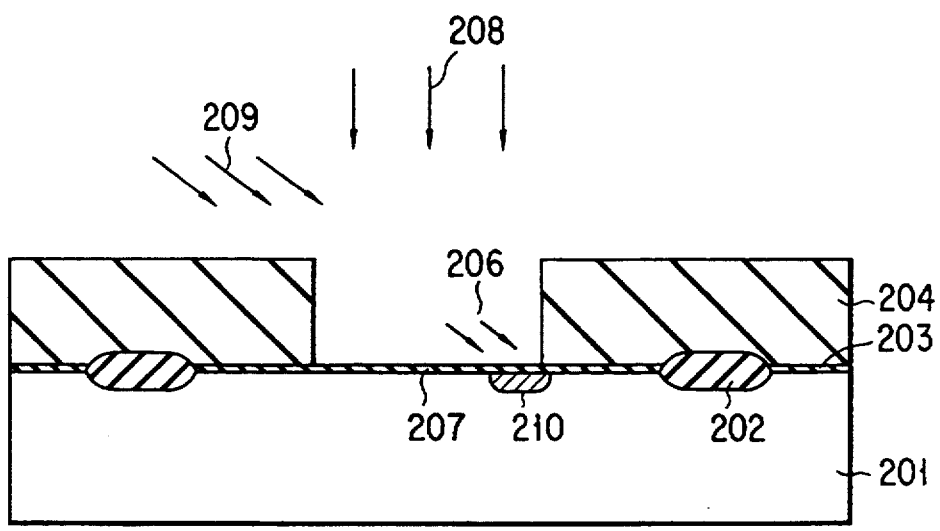
F I G. 4B

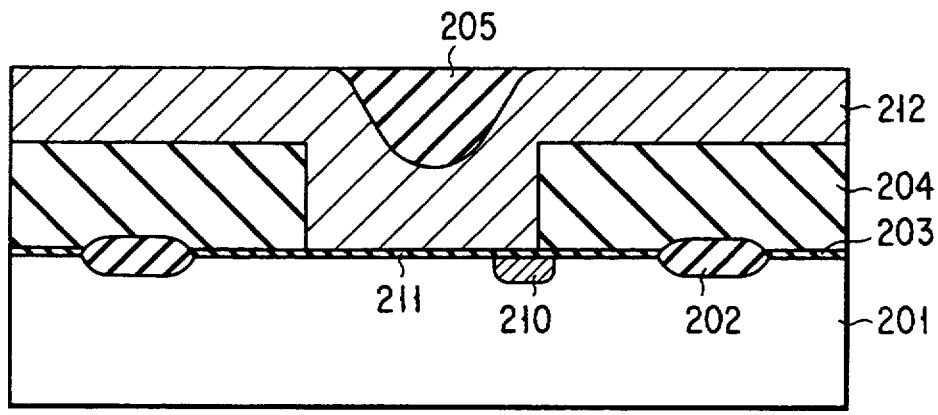
F I G. 4C
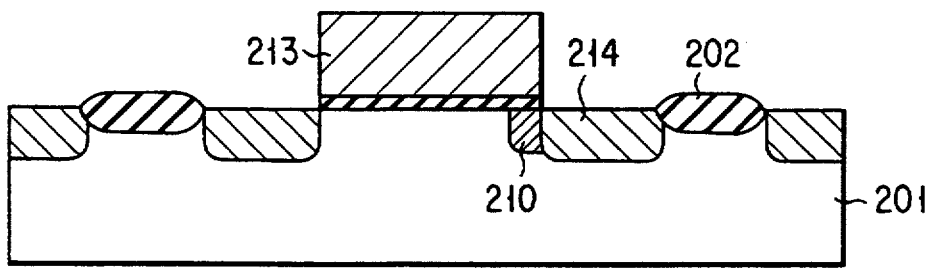
F I G. 4D
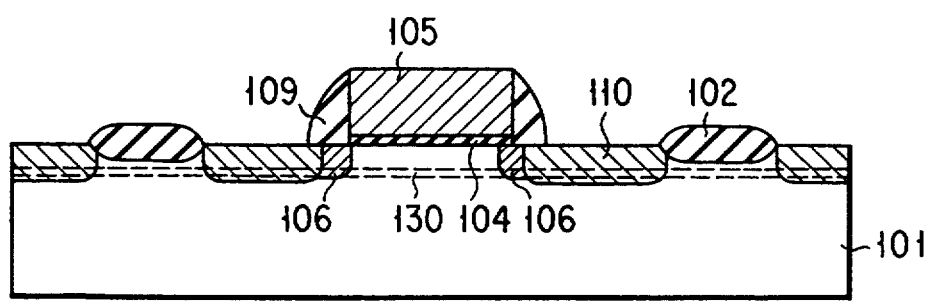
F I G. 5

METHOD FOR MANUFACTURING MOSFET HAVING AN LDD STRUCTURE

This is a continuation of application Ser. No. 07/942,943, filed Sep. 10, 1992, now abandoned.

BACKGROUND OF THE INVENTION

1. Field of the Invention

The present invention relates to an improvement in a semiconductor device having an LDD (Light Doped Drain) structure.

2. Description of the Related Art

In a semiconductor device, elements have been more and more microminiaturized in a higher and higher packing density in recent years. The elements have been microminiaturized in accordance with the scaling law. In actual practice, however, this tendency is often not accompanied with the corresponding scaling of a power supply voltage. This is because it is necessary to make an associated integrated circuit TTL-compatible and its elements at a high operation speed type. It has been known that the absence of the attendant scaling of the power supply voltage exerts various adverse effects upon the semiconductor elements. There is, for example, a degradation in the characteristic of a MOSFET caused by a hot carrier. This is caused by a higher electric field in the vicinity of the drain in a MOSFET thus microminiaturized.

In the existing technique, a low impurity concentration area is provided in the vicinity of the drain and a side-wall LDD structure is employed so as to relax an electric field close to the drain. This is done so as to suppress the generation of a hot carrier and hence to improve the reliability of MOSFET's.

The manufacture of a side-wall LLD type n-MOSFET will be explained below by way of example.

FIGS. 1 to 3 show the method for the manufacture of a side-wall LLD type n-MOSFET.

As shown in FIG. 1, an oxide film 102 for elements isolation is created, by a selective oxidation method, in and on a p type silicon substrate 101. This provides an n-MOSFET's element area and its isolation area at the substrate 101. Further, a boron (B) ion 103 for threshold control is implanted, at an acceleration voltage of 20 [keV] and a dose of about $2 \times 10^{12}$ [cm$^{-2}$], into the element area of the n-MOSFET.

Then an about 10 [nm]-thick silicon oxide film 104 is formed, by a thermal oxidation method, on the element area of the n-MOSFET as shown in FIG. 2. An about 400 [nm]-thick polysilicon film 105 is deposited, by an LPCVD method, over the silicon oxide film 104. Then annealing is carried out, for about 30 minutes, in a POCl$_3$ atmosphere at about 900° C. to diffuse phosphorus (P) in the polysilicon film 105. As a result, the polysilicon film 105 becomes an n-type and a low ohmic state. Then the polysilicon film 105 is patterned by a photoetching method to provide a gate electrode 105. Then phosphorus (P) ion is implanted, at an acceleration voltage 50 [keV] and a dose of about $7 \times 10^{13}$ [cm$^{-2}$], into the element area of the n-MOSFET with the gate electrode 105 used as a mask. A low concentration n$^-$ diffusion layer 106 is formed in the element area of the n-MOSFET. Then about 15 [nm]-thick thermal oxide film 107 is formed by the thermal oxidation method on the element area of n-MOSFET. This activates the phosphorous (P) in the n$^-$ diffusion layer 106 and prevents leakage of electric charges across the edge of the gate electrode 105 and the n$^-$ diffusion layer 106. Then about 150 [nm]-thick silicon oxide (SiO$_2$) film 108 is formed on the whole surface of a resultant structure.

As shown in FIG. 3, the silicon oxide film 108 is etched, by an anisotropic etching, to leave the silicon oxide film 108 only on the side wall of the gate electrode 105. As a result, a side-wall oxide film 109 is provided on the side wall of the gate electrode 105. Using the gate electrode 105 and side-wall oxide film 109 as a mask, an arsenic (As) ion is implanted in the element area of n-MOSFET at an acceleration voltage of 40 [keV] and a dose of about $5 \times 10^{15}$ [cm$^{-2}$], providing high concentration n$^+$ diffusion layers (source and drain regions) 110. Annealing is effected for 30 minutes in an N$_2$ atmosphere at about 850° C. As a result, the arsenic in the n$^+$ diffusion layer 110 is activated and the silicon substrate 101 can be recovered from a damage caused under the ion implantation process.

A metallization step, though being not shown, is performed, thus completing an n-MOSFET of a gate side-wall LLD structure.

According to the aforementioned manufacturing method, the n$^-$ diffusion layer 106 is formed nearer to the gate electrode by the thickness of the side-wall oxide film 109 with the n$^+$ diffusion layer 110 as a reference. It is possible to form the n$^-$ diffusion layer 106 and n$^+$ diffusion layer 110 in a self-aligned relation to the gate electrode. It is, therefore, possible to relax the concentration of an electric field in the vicinity of the drain region and to provide a MOSFET of high reliability.

In MOSFET manufactured by the aforementioned method, the hot carrier is suppressed by the low concentration n$^-$ diffusion layer and it is possible to implement a MOSFET of high reliability. There is, however, a drawback in that the operation speed of MOSFET is delayed due to a fall in drain current resulting from the parasitic resistance of the n$^-$ diffusion layer. Further, during the operation of MOSFET, charges are moved below the side-wall oxide film 109 due to the generation of a hot carrier. As a result, the n$^-$ diffusion layer below the side-wall oxide film 109 is depleted, resulting in an increase in resistance of the n$^-$ diffusion layer and a decrease in channel conductance gm and hence in a degeneration in the characteristic of MOSFET.

Further, there is a drawback from the standpoint of microminiaturizing elements, as will be set out below.

That is, provided that a MOSFET has a gate length of about 500 [nm] and a side-wall oxide film about 15 [nm] thick, the size of such MOSFET is increased by an amount corresponding to twice the thickness of the side-wall oxide film, that is about 30 [nm], compared with the case where a MOSFET has no such side-wall oxide film. As a result, the substantial size of the gate electrode is increased by about 30%, thus presenting a bar to the microminiaturization of a MOSFET.

SUMMARY OF THE INVENTION

It is accordingly the object of the present invention to provide a semiconductor device which forms an n$^-$ diffusion layer in the surface portion of a semiconductor substrate at any given area beneath a gate electrode, without forming a side-wall oxide film, whereby it is possible to improve the characteristic of an n-MOSFET and hence to achieve a high-reliable n-MOSFET.

In order to achieve the aforementioned object of the present invention, a semiconductor device is provided which comprises a semiconductor substrate, source and drain regions formed in a surface portion of the semiconductor substrate, a gate electrode formed over a channel region between the source region and the drain region, and an impurity area formed beneath the gate electrode only and at an area adjacent the drain region and having a predetermined concentration.

Further, a high concentration impurity area may be formed in the surface portion of the substrate at an area beneath the channel area so as to prevent a punch-through.

In another aspect of the present invention, a method is provided for manufacturing a semiconductor device. A first film is formed on a semiconductor substrate and an opening is formed in the first film. With the first film used as a mask, an impurity ion is implanted in the surface portion of the semiconductor substrate in a direction of an angle $\theta$ ($0° < \theta < 90°$) to a substrate face to provide an impurity area in the surface portion of the substrate at an edge area of the opening. An insulating film is formed on the surface of the semiconductor substrate at an area corresponding to the opening. After the first film has been removed, a gate electrode is formed at that opening area with the gate electrode used as a mask, an impurity ion is implanted into the surface portion of the substrate to provide source and drain region there.

After an opening has been formed in the first film, with the first film used as a mask, an impurity ion may be implanted into the surface portion of the semiconductor substrate in a direction of 90° to a substrate face to form a high concentration impurity area for preventing a punch-through in the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a cross-sectional view showing a step of forming a step of forming an n-MOSFET according to a method of the present invention;

FIG. 4B is a cross-sectional view showing a step of forming the n-MOSFET according to the method of the present invention;

FIG. 4C is a cross-sectional view showing a step of forming the n-MOSFET according to the method of the present invention;

FIG. 4D is a cross-sectional view showing a step of forming the n-MOSFET according to the method of the present invention;

FIG. 5 is a cross-sectional view showing a convention n-MOSFET;

DETAILED DESCRIPTION OF THE PREFERRED EMBODIMENTS

Figure 1:
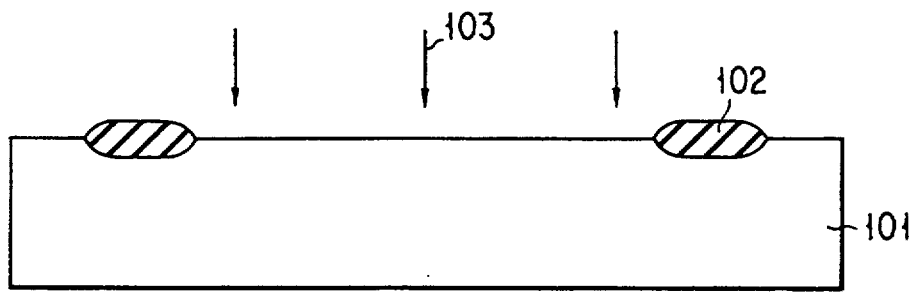
FIG. 1 is a cross-sectional view showing a step of forming a conventional n-MOSFET.
Figure 2:
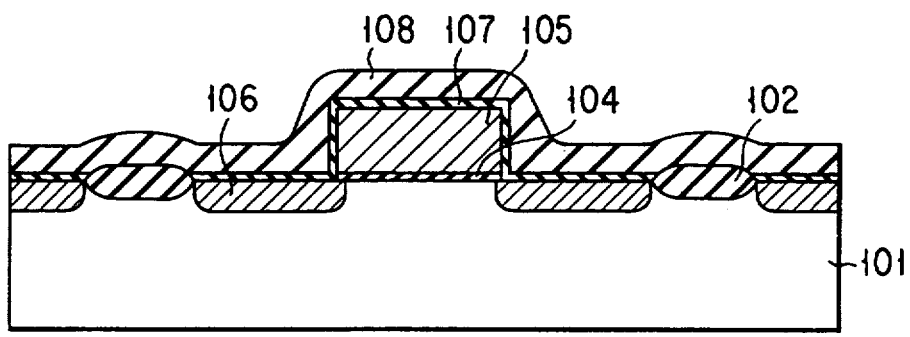
FIG. 2 is a cross-sectional view showing a step of forming the conventional n-MOSFET.
Figure 3:
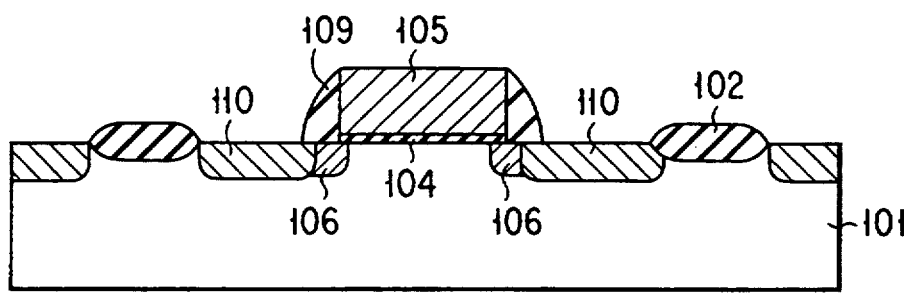
FIG. 3 is a cross-sectional view showing a step of forming the convention n-MOSFET.

The embodiments of the present invention will be explained below with reference to the accompanying drawings.

FIGS. 4A to 4D show a method for manufacturing a side-wall LDD type n-MOSFET according to one embodiment of the present invention.

As shown in FIG. 4A, an oxide film 202 for element isolation is formed in and on a p type silicon substrate 201 by a selective oxidation method, thus providing an n-MOSFETs element area and isolation area. A about 30 [nm]-thick thermal oxide film ($SiO_2$) 203 is formed on the element area of the n-MOSFET by a thermal oxidation method. Then an about 500 [nm]-thick film, such as a silicon nitride (SiN) film, whose etching rate has a given selective etching ratio relative to that of $SiO_2$ and Si is formed on the thermal oxide film 203, followed by the photoetching of the silicon nitride film 204 and thermal oxide film 203 at an area corresponding to a gate electrode.

The silicon nitride film 204 and thermal oxide film 203 are etched in a manner as will be set out below.

First a resist film 205 is coated over the silicon nitride film 204, followed by the patterning of the resist film 205 using a black/white inverted pattern, that is, a mask pattern conventionally used for gate electrode patterning and used here as a black/white inverted pattern. Then the silicon nitride film 204 is etched with the resist film 205 used as a mask. With the silicon nitride film 204 used as a mask, the thermal oxide film 203 is etched by $NH_4F$, thus providing an opening 206 at an area corresponding to a gate electrode formation area.

As shown in FIG. 4B, an about 12 [nm]-thick thermal oxide film 207 is formed, by a thermal oxidation method, on that area where the thermal oxide film 203 has been removed. A boron (B) ion for threshold level control is implanted, at an acceleration voltage of 20 [keV] and dose of about $2 \times 10^{12}$ [$cm^{-2}$], into the element area of the n-MOSFET with the silicon nitride film 204 used as a mask, that is, implanted in a direction perpendicular to a 201 face of the substrate, noting that the boron ion is implanted into that opening 206 only, not at the whole element area of the n-MOSFET in a conventional technique. Then, with the silicon nitride film 204 used as a mask, an n-type impurity ion 209, such as phosphorus (P) and arsenic (As), is implanted into the element area of the n-MOSFET at an acceleration voltage of 60 [key] and dose of about $7 \times 10^{13}$ [$cm^{-2}$], that is, implanted in a direction of an angle D ($0° < \theta < 90°$), for example, 30° to a 201 face of the substrate. As a result, an n$^-$ diffusion layer 210 is formed in the surface portion of the substrate at an edge area of the opening 206, noting that the n$^-$ diffusion layer 210 can be formed at any concentration gradient: at any given place by controlling the thickness of the silicon nitride film 204, the length (gate length) of the opening 206, the angle $\theta$ at which the impurity ion is implanted and the number of times the impurity ion is implanted.

As shown in FIG. 4C, the thermal oxide film 207 damaged at the ion implantation step is etched by $NH_4F$ and an about 10 [nm]-thick gate oxide film 211 is formed by the thermal oxidation method at an area where the thermal oxide film 207 has been removed. As the gate oxide film 211, use can be made of $SiO_2$, ONO in Si and $Ta_2O_5$ layer for instance. An about 400 [nm]-thick polysilicon film 212 is provided on the whole surface of a resultant structure with the use of an LPCVD method, completely burying the opening 206 with the polysilicon film 212. As the film buried in the opening 206 use may be made of not only polysilicon but also other proper films, provided that a good coverage can be obtained. For example, as such use may be made of, for example, either a high melting point metal film such as W and Ti or a polysilicon/high melting point metal laminated structure (polyside structure). Annealing is carried out for about 30 minutes in an atmosphere of $POCl_3$ at about 900° C. to diffuse phosphorus (P) in the polysilicon film 212. As a result, the polysilicon film 212 becomes an n-type and low-ohmic. It is to be noted that a P type impurity doping can be employed instead at the heat treatment step.

After a resist 205 has been formed on the whole surface of a resultant structure, the polysilicon film 212 is etched back to the surface level of the silicon nitride film 204 as shown in FIG. 4D. The silicon nitride film 204 is completely removed by an anisotropic selective etching, leaving a gate electrode 213 of the n-MOSFET. With the gate electrode 213 used as a mask, an arsenic (As) ion is implanted into the element area of n-MOSFET at an acceleration voltage of 50 [kev] and a dose of about $5 \times 10^{15}$ [$cm^{-2}$]. As a result, high concentration n+ diffusion layers (source and drain) 214 are formed at those element areas of n-MOSFET in a self-aligned relation. Annealing is performed for about 30 minutes in an $N_2$ atmosphere at about 850° C. to activate arsenic (As) in the n+ diffusion layer 214, while recovering the silicon substrate 201 from its damaged state involved. Then a metallization step is performed to complete a side-wall LDD type n-MOSFET.

According to the aforementioned manufacturing method, an n− diffusion layer 210 is formed beneath the gate electrode 213 prior to forming the gate electrode 213. That is, the concentration gradient of the n− diffusion layer for electric field relaxation is controlled principally by a side-wall oxide film and it is possible to prevent adverse effects caused by a parasitic resistance, such as a decrease in drain current and a degeneration of the characteristic of the element involved, as compared with the case where the n− diffusion layer is conventionally formed beneath the side wall oxide film.

The concentration gradient of the n− diffusion layer 210 can be freely set by varying the angle at which, and the number of times, the ion is implanted. For this reason, the electric field is properly relaxed in the vicinity of the drain, thus achieving a high-reliable MOSFET.

In the side-wall LDD type n-MOSFET manufactured by the conventional method, the n− diffusion layer has been necessarily formed beneath the side-wall oxide film, that is, beneath both the side walls of the oxide film whether on the source side or on the drain side. According to the present invention, as the n− diffusion layer can be selectively formed on the drain side only, the channel resistance is decreased, thus ensuring a high-performance MOSFET.

Further, according to the present invention, since the opening is formed by the photoetching method, the concentration profile, etc., of the n− diffusion layer can be controlled by changing the size of that opening. By the use of the photoetching method, the n− diffusion layer can be formed in the vicinity of the drain region at that MOSFET where an improved reliability, that is a relaxed electric field, is necessary. In those memory cells of an SRAM, for example, it is possible to relax an electric field in the vicinity of the drain by forming an n− diffusion layer at an area near the drain of a driver transistor calling for improved reliability.

In the case where the short channel effect is suppressed, a bom (B) ion is conventionally implanted into the element area of an n-MOSFET, at the implantation of an ion for threshold level control, so as to prevent a punch-through. In this case, on the other hand, a p type high concentration area 130 is formed even beneath an n+ diffusion layer 110 as shown, for example, in FIG. 5. For this reason, a junction capacity of the n+ diffusion layer 110 is increased and hence the load of the n-MOSFET is increased, delaying the operation speed of the n-MOSFET.

Figure 6:
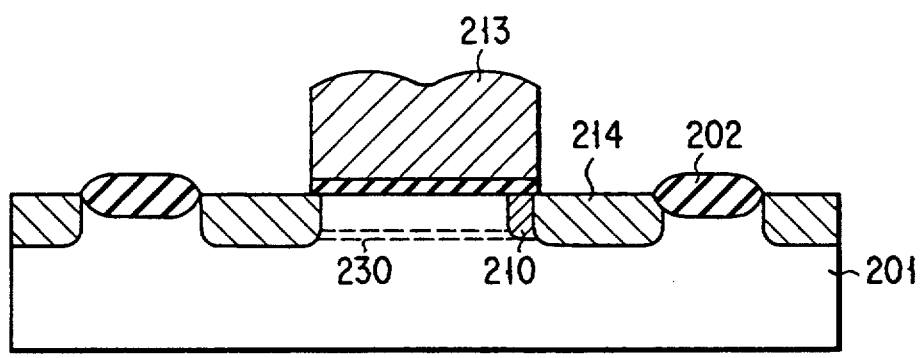
FIG. 6 is a cross-sectional view showing an n-MOSFET according to one embodiment of the present invention.

According to the present invention, a channel stopper boron (B) ion is implanted into the element area of n-MOSFET, using the silicon nitride film, that is the silicon nitride film having an opening only at the gate electrode formation area, as a mask. As shown, for example, in FIG. 6, a p-type high concentration area 230 is formed only beneath the channel of n-MOSFET. Therefore, the short channel effect can be suppressed without increasing the junction capacity of n+ diffusion layer 110. The concentration gradient and position of the p type high concentration area 230 can be controlled by the angle at, and the number of times, the ion is implanted.

Although, in the aforementioned embodiment, the present invention has been explained in connection with n-MOSFET, it can naturally be applied also to a p-MOSFET.

Figure 7:
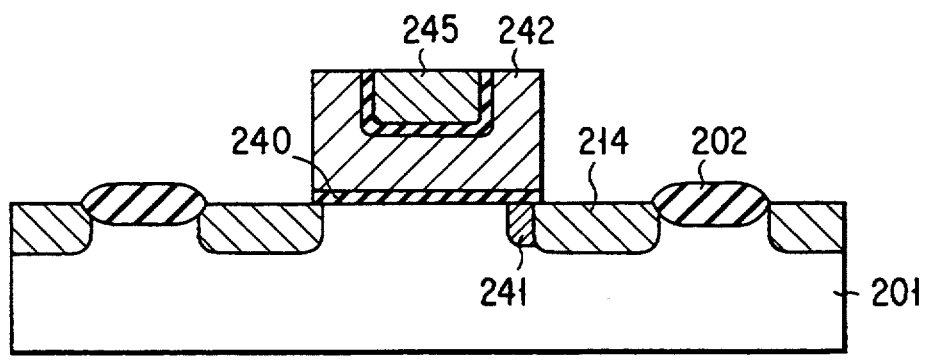
FIG. 7 is a cross-sectional view showing an n-MOSFET according to the embodiment of the present invention.

FIG. 7 shows a floating gate type n-MOSFET, such as an EEPROM, according to another embodiment of the present invention. The operation of this semiconductor device is performed as will be set out below.

With a high voltage applied to a control gate 245, those hot electrons generated in the vicinity of a channel are injected into a floating gate 242 past a gate oxide film 240. In a state in which charges are stored in the floating gate 242, the threshold voltage of n-MOSFET stays high. In a state in which charges are released out of the floating gate 242, the threshold voltage of n-MOSFET stays low.

A p+ diffusion layer 241 can be formed adjacent an n+ diffusion layer 214 by applying the method of the present invention to EEPROM. The p+ diffusion layer 241 is readily formed by implanting a boron (B) ion at an acceleration voltage of about 100 [keV] and dose of about $2 \times 10^{13}$ [$cm^{-2}$], for example, in the arrangement of FIG. 4B.

In the arrangement shown in FIG. 7, when hot electrons are injected into the floating gate 242, an electric field in the vicinity of a drain is enhanced due to the presence of the p+ diffusion layer 241, thus enhancing the generation efficiency of the hot electrons. Further, the operation of the element can be sped up because an increase in the junction capacity of the n+ diffusion layer 214 is not involved.

According to the present invention, prior to forming the gate electrode, a low or a high concentration impurity region can be formed at a given area beneath the gate electrode. Further, such an impurity region can be formed as any given concentration gradient irrespective of whether a p type or an n type. By so doing it is possible to achieve those advantages as will be set out below.

First an advantage as will be set out below is obtained from the standpoint of relaxing an electric field involved. That is, using as a mask a silicon nitride film having the same aperture pattern as that of the gate electrode, an impurity ion is implanted, a predetermined number of times, in a direction of an angle $\theta$ ($0° < \theta < 90°$) to a substrate face, making it possible to freely control the concentration gradient of the impurity region involved. For this reason, an electric field at the drain of MOSFET can be properly relaxed, thus offering a high-reliable MOSFET. Since a low concentration impurity layer can be formed on the drain side only, the channel resistance can be reduced and hence it is possible to provide a high-performance MOSFET.

An advantage can also obtained from the standpoint of suppressing the short channel effect.

The short channel effect can be suppressed without increasing the junction capacity of the source or drain because a p type high concentration region is provided for preventing a punch-through at an area beneath the channel of MOSFET.

In the n-MOSFET using the floating gate, a p type impurity ion is implanted at an area beneath the gate electrode in the neighborhood of the drain to provide an abrupt concentration gradient. By so doing, it is possible to enhance the generation efficiency of host electrons, without increasing the junction capacity of a source or a drain, so that it is possible to speed up the operation of the element.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing a semiconductor device comprising the steps of:
   (1) forming a first insulating film on a semiconductor substrate of a first conductivity type;
   (2) forming an opening in the first insulating film;
   (3) implanting ions of a second conductivity type through the opening in the first insulating film to form an impurity region in the semiconductor substrate, wherein the ions are implanted at an oblique angle with respect to the surface of the semiconductor substrate and wherein the impurity region is formed primarily along a drain side of a channel region defined by the opening and wherein an impurity region is not formed along a source side of the channel region;
   (4) forming a second insulating film over a surface of the semiconductor substrate at an area corresponding to the opening;
   (5) forming a conductive film at the opening area;
   (6) removing the first insulating film from the semiconductor structure and forming a gate electrode at the opening area, the gate electrode being formed from the conductive film; and
   (7) implanting an impurity ion of the second conductivity type in the surface portion of the substrate with the gate electrode used as a mask and forming source and drain regions in the surface portion of the substrate.

2. The method of claim 1 wherein the first insulating film is used as a mask for the oblique ion implantation step so that at least a portion of the channel region is masked from ion implantation by a portion of the first insulating film.

3. The method of claim 1 wherein the first insulating film is silicon nitride.

4. The method according to claim 1, wherein the impurity region is formed at a lower impurity concentration than the drain region in a position beneath the gate electrode and adjacent the drain region in the surface portion of the substrate by controlling the thickness of the first insulating film or the angle $\theta$ at which the impurity ion is implanted into the substrate.

5. The method according to claim 1 further comprising the step of implanting ions of the first conductivity type through the opening in the first insulating layer into the substrate to form a high concentration impurity region to prevent punch-through in the substrate before the formation of the second insulating layer.

6. The method according to claim 1, further comprising the step of implanting an impurity ion of the first conductivity type into the surface of the substrate with the first insulating film used as a mask and forming an impurity region so as to prevent a punch-through in the substrate, the implanting step being effected between the second and third steps.

7. The method according to claim 1, wherein the fifth step of forming a conductive film comprises the step of depositing the conductive film so that the conductive film is deposited on the first insulating film and so that the conductive film fills the opening in the first insulating film.

8. The method according to claim 1, wherein the fifth step of forming a conductive film further comprises the steps of patterning the conductive film and removing the conductive film from the surface of the insulating film while leaving a portion of the conductive film within the opening.

* * * * *